United States Patent
Toguchi et al.

(10) Patent No.: US 8,138,501 B2
(45) Date of Patent: Mar. 20, 2012

(54) SWITCHING ELEMENT AND MANUFACTURING METHOD THEREOF

(75) Inventors: Satoru Toguchi, Tokyo (JP); Masahiko Ishida, Tokyo (JP); Hiroyuki Endoh, Tokyo (JP)

(73) Assignee: NEC Corporation, Tokyo (JP)

(*) Notice: Subject to any disclaimer, the term of this patent is extended or adjusted under 35 U.S.C. 154(b) by 111 days.

(21) Appl. No.: 12/529,564

(22) PCT Filed: Feb. 7, 2008

(86) PCT No.: PCT/JP2008/052067
§ 371 (c)(1),
(2), (4) Date: Oct. 23, 2009

(87) PCT Pub. No.: WO2008/108136
PCT Pub. Date: Sep. 12, 2008

(65) Prior Publication Data
US 2010/0102324 A1 Apr. 29, 2010

(30) Foreign Application Priority Data
Mar. 2, 2007 (JP) .................. 2007-053512

(51) Int. Cl.
*H01L 29/16* (2006.01)
(52) U.S. Cl. ....... 257/66; 257/24; 257/57; 257/E29.082; 438/478; 977/708; 977/742
(58) Field of Classification Search ............ 257/24, 257/66, 57, 192, E29.082, E21.051, E27.029, 257/E29.255; 438/478; 977/708, 742
See application file for complete search history.

(56) References Cited

U.S. PATENT DOCUMENTS

| 7,005,674 B2 * | 2/2006 | Lee et al. ............ 257/40 |
| 2005/0140840 A1 * | 6/2005 | Hirakata et al. .......... 349/43 |
| 2010/0127241 A1 * | 5/2010 | Gruner et al. ............ 257/20 |

FOREIGN PATENT DOCUMENTS

| JP | 2005-175386 A | 6/2005 |
| JP | 2005-303270 A | 10/2005 |
| JP | 2005-347378 A | 12/2005 |
| JP | 2006-073774 A | 3/2006 |
| JP | 2006-265534 A | 10/2006 |

OTHER PUBLICATIONS

International Search Report for PCT/JP2008/052067 mailed Apr. 22, 2008.
E. S. Snow, et al., "Random Networks of Carbon Nanotubes as an Electronic Material", Applied Physics Letters, Mar. 2003, pp. 2145-2147, vol. 82, No. 13.
E. Artukovic, et al., "Transparent and Flexible Carbon Nanotube Transistors", Nano Letters, pp. 757-760, vol. 5, No. 4.
S.H. Hur, et al., "Extreme Bendability of Single-Walled Carbon Nanotube Networks Transferred from High-Temperature Growth Substrates to Plastic and Their Use in Thin-Film Transistors", Applied Physics Letters (2005), vol. 86, pp. 243501-1 to 243502-3.
T. Takenobu, et al., "High-Performance Transparent Flexible Transistors Using Carbon Nanotube Films", Applied Physics Letters (2006), vol. 88, pp. 33511-1 to 33511-3.

* cited by examiner

*Primary Examiner* — Davienne Monbleau
*Assistant Examiner* — Fazli Erdem

(57) ABSTRACT

Disclosed is a switching element provided with a gate dielectric film and an active layer disposed in contact with the gate dielectric film. The active layer includes carbon nanotubes, and the gate dielectric film includes non-conjugated polymer containing an aromatic ring in a side chain.

22 Claims, 2 Drawing Sheets

SWITCHING ELEMENT AND MANUFACTURING METHOD THEREOF

TECHNICAL FIELD

This application is the National Phase of PCT/JP2008/052067, filed Feb. 7, 2008, which is based on Japanese Patent Application filed on Mar. 2, 2007 (Application Number: Japanese Patent Application No. 2007-053512) and claims the benefit of priority to the Japanese Patent Application, and the entire disclosure of the Japanese Patent Application is incorporated herein by reference.

The present invention relates to a switching element having an active layer using carbon nanotubes (hereinafter also referred to as CNTs).

BACKGROUND ART

Thin film transistors (TFTs) have been widely used as pixel switching elements in display devices such as liquid crystal displays and EL displays. In recent years, a pixel array driver circuit using TFTs has been increasingly formed on the same substrate. Conventionally, such TFTs have been formed on a glass substrate using amorphous or polycrystalline silicon.

A CVD apparatus used for forming such a TFT using silicon is very expensive and an increase in the area of the display device using TFTs leads to a substantial increase in manufacturing costs. In addition, since a process for forming a film of amorphous or polycrystalline silicon is performed under extremely high temperatures, only materials of high heat resistance such as a glass substrate can be used as a substrate.

Against this backdrop, TFTs using CNTs as active layers have been proposed. As a method of forming the TFTs using CNTs, a wet process such as an application method in which a CNT-dispersed solution in which CNTs are dispersed is applied onto the substrate, followed by drying. Such wet process requires no expensive device such as a CVD apparatus and can achieve an increase in the area at low costs. Furthermore, since the process temperature is low, advantageously, there are only reduced limitations in selecting a material for the substrate. TFTs using such a CNT-dispersed film is disclosed in the following prior art documents (1) to (6):

(1) E. S. Snow, J. P. Novak, P. M. Cambell, D. Park, "Random networks of carbon nanotubes as an electronic material, Applied Physics Letters, vol. 82, No. 13, p.p. 2145-2147 (2003)
(2) E, Artukovic, M. Kaempgen, D. S. Hecht, S. Roth, G. Gruener, "Transparent and Flexible Carbon Nanotube Transistors", Nano Letters, vol. 5, No. 4, p. 757-760
(3) S.-H. Hur, O. O. Park, J. A. Rogers, "Extreme bendability of single-walled carbon nanotube networks transferred from high-temperature growth substrates to plastic and their use in thin-film transistors", Applied Physics Letters, vol. 86, p. 243502 (2005)
(4) T. Takenobu, T. Takahashi, T. Kanbara, K. Tsukagoshi, Y. Aoyagi, Y. Iwasa, "High-performance transparent flexible transistors using carbon nanotube films", Applied Physics Letters, vol. 88, p. 33511 (2006)
(5) Japanese Unexamined Patent Publication No. 2005-347378
(6) Japanese Unexamined Patent Publication No. 2006-73774

For TFTs in which the active layer is in contact with the gate dielectric film, the CNT gets into contact with the gate dielectric film when CNTs are used as the active layer. Known materials for the gate dielectric film include, as disclosed in the prior art reference (2), for example, high polymer materials selected from polyester, polyvinyl, polycarbonate, polypropylene, polyethylene, polyacetate, polyimide or dielectrics thereof.

When an attempt is made to form the active layer including CNTs to be in contact with a gate dielectric film using a conventional gate dielectric film, however, there are cases in which an interaction between the gate dielectric film and the CNTs are not sufficiently obtained. When a solution containing CNTs is applied on the gate dielectric film and dried to form TFTs, for example, there are cases where an interaction between the CNTs in the solution and the surface of the gate dielectric film is insufficient and only an insufficient amount of CNTs are fixed as the active layer, so that sufficient density and uniformity are not obtained. Such uniformity of the amount of fixed CNTs in the active layer leads to variations in switching characteristics of the element and the yield of arrayed elements is largely lowered. To solve this problem, a measure may be taken in which the channel region is surface-treated with aromatic thiol such as mercaptopyridine to fix CNTs at high density. However, according to this measure, the manufacturing process becomes complicated, because, an additional finishing process is required and a patterning process must be added to prevent adhesion to places other than the channel region, thereby contributing to an increase in costs.

For a case where the active layer containing CNTs is previously provided and the gate dielectric film is formed on the active layer, on the other hand, when an interaction between the CNT and the gate dielectric film lacks, it contributes to instability of the interface between the active layer and the gate dielectric film, which becomes one of factors to cause change with time of element characteristics.

DISCLOSURE OF INVENTION

Therefore, an object of the present invention is to provide a switching element which enhances the interaction between CNTs and the gate dielectric film and exhibits excellent and stable transistor characteristics.

In one aspect of the present invention, a switching element includes a gate dielectric film and an active layer provided in contact with the gate dielectric film. The active layer includes carbon nanotubes. The gate dielectric film includes non-conjugated polymer having an aromatic ring in the side chain.

After keen examination for solving the above-mentioned problems, the present inventors have found that the interaction between the surface of the gate dielectric film and CNTs can be improved by forming the gate dielectric film from non-conjugated polymer containing an aromatic ring in the side chain as described above. Thereby, a switching element which exhibits excellent and stable transistor characteristics can be obtained with a low-temperature, convenient and inexpensive process.

In the above-mentioned switching element, the thickness of the gate dielectric film preferably ranges from 0.01 to 1.00 μm. When the thickness is smaller than 0.01 μm, it is difficult to effectively suppress a leak current, and when the thickness is larger than 1.0 μm, it is difficult to effectively control switching phenomenon of the active layer by the gate bias voltage.

In the above-mentioned switching element, in one aspect, it is preferable that the gate dielectric film is formed of a single-layer film. In another aspect, it is preferred that the gate dielectric film has a first gate dielectric film layer which is in contact with the active layer and a second gate dielectric film layer which is not in contact with the active layer and the non-conjugated polymer is contained in the first gate dielectric film layer. As described above, the gate dielectric film may have a two-layered structure. In the case where the two-layered structure is used, the interaction between the CNTs and the gate dielectric film can be improved, when the above-mentioned non-conjugated polymer is contained in the layer in contact with the active layer (first gate dielectric film layer).

In the above-mentioned switching element, in one aspect, it is preferable that the non-conjugated polymer is polymer including at least one type of repeated units A having an aromatic ring in the side chain. In another aspect, it is preferable that the non-conjugated polymer is a copolymer including at least one type of repeated units A having the aromatic ring in the side chain and at least one type of repeated units B having no aromatic ring in the side chain, and the repeated units A are contained five times or more as much as the repeated units B in mole ratio. When the polymer including only the repeated units A is used, the density of the aromatic ring increases and the interaction between the gate dielectric film and the active layer can be improved. On the other hand, if the repeated units B having no aromatic rings in the side chain are introduced in addition to the repeated units A having an aromatic ring in the side chain, the non-conjugated polymer can be prevented from becoming rigid due to the existence of the aromatic ring. When the content of the repeated units A is less than five times of the content of the repeated units B in mole ratio, the density of the aromatic group becomes insufficient and the interaction between the gate dielectric film and the CNTs also tends to become insufficient.

In the above-mentioned switching element, it is preferable that the non-conjugated polymer includes substituted polyethylene skeletons represented by the below-mentioned structural formula as the repeated units:

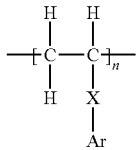

In the formula, X represents a linking group or a single bond, Ar represents an aromatic group having the aromatic ring and n represents a positive integer. The non-conjugated polymer having such a substituted polyethylene skeleton is easy to be subjected to resin treatment and inexpensive. Accordingly, non-conjugated polymer with a desired structure can be obtained at low costs.

In the above-mentioned switching element, it is preferable that the aromatic ring is an aromatic carbocyclic ring.

In another aspect of the present invention, a method of manufacturing a switching element includes a step of forming the gate dielectric film and a step of forming the active layer so as to be in contact with the gate dielectric film. The gate dielectric film contains the non-conjugated polymer having a aromatic ring in the side chain. The active layer contains carbon nanotubes.

In the above-described method of manufacturing the switching element, in one embodiment, the gate dielectric film is formed on a substrate and the active layer is formed after the formation of the gate dielectric film. In this case, it is preferable that the step of forming the active layer includes a step of applying a carbon nanotube dispersed solution in which the carbon nanotubes are dispersed onto the gate dielectric film and a step of drying the applied carbon nanotube dispersed solution. Furthermore, it is preferable that the step of forming the gate dielectric film includes a step of applying a solution containing non-conjugated polymer on the substrate and a step of drying the applied solution.

In another embodiment, the active layer is formed on the substrate and the gate dielectric film is formed after the formation of the active layer. In this case, it is preferable that the step of forming the active layer includes a step of applying a carbon nanotube dispersed solution in which the carbon nanotubes are dispersed onto the substrate and a step of drying the applied carbon nanotube dispersed solution. Furthermore, it is preferable that the step of forming the gate dielectric film includes a step of applying a solution containing the non-conjugated polymer on the substrate and a step of drying the applied solution.

In the manufacturing method of the switching element, in one aspect, it is preferable that the non-conjugated polymer is the polymer including at least one type of repeated units A having the aromatic group in the side chain. In another aspect, it is preferred that the non-conjugated polymer is copolymer including at least one type of repeated units A having the aromatic ring in the side chain and at least one type of repeated units B having no aromatic ring in the side chain, and the repeated units A are contained five times or more as much as the repeated units B in mole ratio.

In the above-described method of manufacturing the switching element, it is preferable that the non-conjugated polymer contains substituted polyethylene skeletons represented by the below-mentioned structural formula as the repeated units:

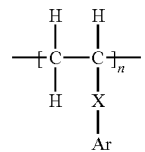

In the formula, X represents the linking group or the single bond, Ar represents the aromatic group having the aromatic ring and n represents a positive integer.

In the above-mentioned switching element, it is preferable that the aromatic ring is an aromatic carbocyclic ring.

According to the present invention, a switching element is provided which improves the interaction between CNTs and the gate dielectric film and exhibits excellent and stable transistor characteristics.

BEST MODE FOR CARRYING OUT THE INVENTION

First Embodiment

Figure 1A:
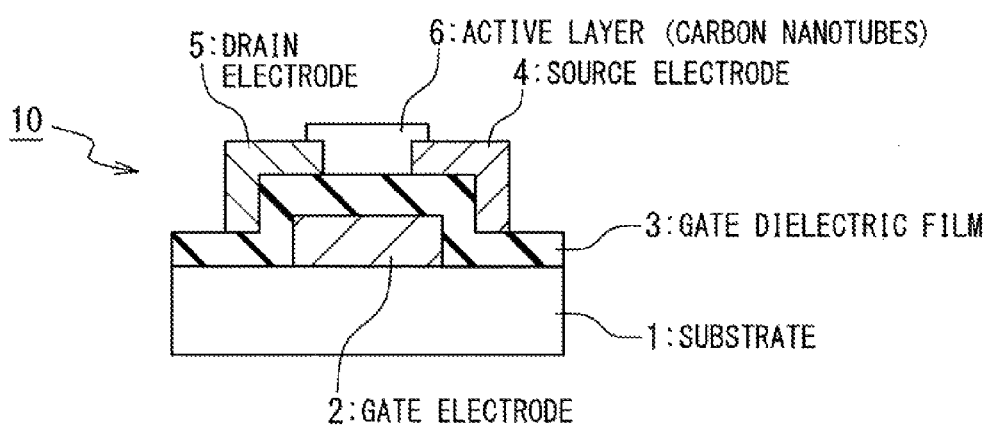
FIG. 1A is a schematic sectional view showing a configuration of a switching element in a first embodiment.

The configuration of a switching element 10 in a first embodiment of the present invention will be described referring to the Drawings.

FIG. 1A is a schematic sectional view showing the configuration of the switching element 10 according to the present invention. As shown in FIG. 1A, the switching element 10 includes: a supporting substrate 1; a gate electrode 2 formed on the supporting substrate 1; a gate dielectric film 3 provided on the supporting substrate 1 so as to cover the gate electrode 2; source and drain electrodes 4 and 5 which are provided on the gate dielectric film 3 at a distance therebetween corresponding to the channel length; and an active layer 6 provided in contact with all of the gate dielectric film 3, the source electrode 4 and the drain electrode 5. As described above, the switching element 10 in the present embodiment is a so-called bottom-contact type thin film transistor.

The material of the supporting substrate 1 is not specifically limited. For example, inorganic materials such as glass, quarts and silicon wafer, polyethylene resin such as polyethylene sulfide, polyethylene naphthalate and polyethylene terephthalate, and high polymer materials such as polyamide and polycarbonate may be used. The reason why the material of the supporting substrate 1 is not specifically limited is that, as described later, a high process temperature is not required to form the switching element 10 of the present invention.

Materials for the source electrode 4, the drain electrode 5 and the gate electrode 3 are not specifically limited as long as they have sufficient electrical conductivity. However, the electrode which acts as a charge injection electrode preferably has an excellent property in charge injection into CNTs. Such materials include metals and alloys, such as indium tin oxide alloy (ITO), tin oxide (NESA), gold, silver, platinum, copper, indium, aluminum, magnesium, magnesium-indium alloy, magnesium-aluminum alloy, aluminum-lithium alloy, aluminum-scandium-lithium alloy and magnesium-silver or oxides thereof and organic materials such as conductive polymers.

The active layer 6 contains a film in which carbon nanotubes (CNT) are dispersed (hereinafter also referred to as a CNT-dispersed film). The CNTs used in the active layer 6 are not specifically limited as long as the used CNTs have sufficient semiconductor characteristics as the CNT-dispersed film. Methods of forming the CNTs include publicly known methods such as an arc discharge method, a laser ablation method and a CVD method. Two types of CNTs: single wall nanotubes (SWNT) formed of a single carbon layer and multiwall nanotubes (MWNT) formed of a plurality of carbon layers are known. Some SWNTs have semiconductor characteristics and the other SWNTs have electrical conductor characteristics, and the MWNTs are formed by randomly combining these characteristics. In the case where CNTs having electrical conductor characteristics exist in the CNT-dispersed film, it may contribute to a rise of the OFF current. Thus, in application requiring low power consumption, it is desired that the presence ratio of CNTs having electrical conductor characteristics in the CNT-dispersed film is as low as possible.

The gate dielectric film 3 contains non-conjugated polymer. The non-conjugated polymer has a structure formed of a main chain and side chains. The side chains contain an aromatic group and the main chain has a non-conjugated structure.

When such non-conjugated polymer is used in the gate dielectric film 3, the aromatic group contained in the side chain is exposed on the film surface or hangs from the film surface at certain probability in the thin film formation. Then, an interaction is made between the $\pi$ electron cloud of the aromatic group and the $\pi$ electron cloud of the CNTs exposed onto the CNT surface, which is contained in the active layer 6. By the attractive force caused by this interaction, the CNTs are strongly fixed to the surface of the gate dielectric film 3. Accordingly, the interaction between the gate dielectric film 3 and the active layer 6 containing the CNTs can be improved.

Furthermore, when polymer having a main chain containing a conjugated structure is used in the gate dielectric film 3, the conductivity of the whole of the gate dielectric film 3 is increased, and thus the function of the gate dielectric film 3 to suppress the leak current flowing between the gate electrode and the other electrodes cannot be satisfactorily performed. Therefore, the main chain must have a non-conjugated structure.

When an aromatic group is introduced into the main chain for the gate dielectric film 3, the gate dielectric film 3 loses its flexibility and tends to be rigid, although the above-mentioned interaction is made between the aromatic group and the CNTs. When the gate dielectric film 3 is rigid, it is difficult to adopt flexible substrate materials, largely impairing the degree of freedom in selecting the supporting substrate. Even if a flexible substituent group is introduced into the side chain to prevent the above-mentioned situation, the number of the exposed aromatic groups on the surface of the gate dielectric film 3 decreases, so that the effect of improving the interaction between the CNTs and the surface of the dielectric film, which is the original objective, cannot be obtained. When the aromatic group is introduced into the side chain as in the present embodiment, on the contrary, the film can be prevented from becoming rigid and the number of the exposed aromatic groups can be maintained, since the flexibility of the main chain does not tend to be impaired.

The non-conjugated polymer may be polymer including only repeated units containing a substituent group having an aromatic group in the side chain (hereinafter referred to as A) or a copolymer including repeated units A and repeated units including no substituent group having an aromatic group in the side chain (hereinafter referred to as B). When polymer including only the repeated units A is used, the density of the aromatic groups is increased and a strong interaction between the CNTs and the gate dielectric film 3 can be expected. On the other hand, when the density of the aromatic groups is too high, the gate dielectric film 3 may lose its flexibility. In this case, the use of the copolymer of the repeated units A and the repeated units B allows adjusting the density of the aromatic groups and thus, the interaction is made between the CNTs and the gate dielectric film 3 without losing the flexibility. However, when the copolymer is used, it is preferred that the repeated units A are contained five times or more as much as the repeated units B in mole ratio. When the mole content ratio of the repeated units A to the repeated units B is less than five times, the density of the aromatic groups becomes too low and a sufficient interaction between the CNTs and the gate dielectric film 3 cannot be obtained.

A plurality of aromatic groups may be contained in the side chain of the repeated units A. Furthermore, when a plurality of side chains exist, the aromatic group may be contained in each of the plurality of side chains. When the copolymer is employed, a plurality of types of repeated units A or a plurality of types of repeated units B may be contained.

In the following, a specific description is given of the above-mentioned repeated units A and the repeated units B.

It is preferable that the repeated units A adopt a skeleton represented by the following structural formula (1):

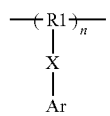
(1)

In the formula (1), R1 represents the main chain structure, X represents a linking group or a single bond, Ar represents an aromatic group and n represents a positive integer.

As represented by the above-mentioned structural formula (1), the aromatic group is easy to be exposed onto the surface of the non-conjugated polymer and the interaction between the CNTs and the gate dielectric film 3 can be expected, since the aromatic group is located at the end of the linking group X in the side chain (X—Ar).

Specific examples of the repeated units A represented by the formula 3 include a substituted polyethylene skeleton into which the (X—Ar) group is introduced as the side chain, a substituted polyester skeleton into which the (X—Ar) group is introduced as the side chain, a substituted polyether skeleton into which the (X—Ar) group is introduced as the side chain, a substituted polyamide skeleton into which the (X—Ar) group is introduced as the side chain, a substituted polyethylenesulfide skeleton into which the (X—Ar) group is introduced as the side chain and a substituted siloxane polymer skeleton into which the (X—Ar) group is introduced as the side chain. A substituted polyethylene terephthalate skeleton into which the (X—Ar) group is introduced as the side chain is one example of the substituted polyester skeleton into which the (X—Ar) group is introduced as the side chain. Among them, the substituted polyethylene skeleton into which the (X—Ar) group is introduced as the side chain, as represented by the following structural formula (2), is used most preferably in terms of easiness of resin treatment (synthesis) and costs:

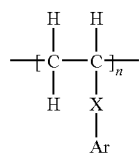
(2)

In the formula, X represents a linking group, Ar represents an aromatic ring and n represents a positive integer.

In terms of the heat resistance and electrical resistance, the use of the polyamide skeleton is more preferable. However, the skeleton is not limited to the above-mentioned skeletons, as long as the main chain has no conjugated structure.

When copolymer is used as the non-conjugated polymer, it is preferable that the repeated units B adopts a skeleton represented by the following structural formula (3).

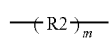
(3)

In the formula, R2 represents a main chain structure and m represents a positive integer.

For the main chain structure R2, the same skeleton as described for the repeated units A can be adopted except that the (X—Ar) group is not introduced as the side chain.

Subsequently, a description is given of the aromatic group Ar. As an example of the aromatic group represented by Ar in the above-mentioned structural formulae (1) and (2), both of a group having an aromatic carbocyclic ring and a group having an aromatic heterocyclic ring may be used. However, it is preferable that the group having the aromatic carbocyclic ring is used in terms of availability. Examples of the group having the aromatic carbocyclic ring include aromatic hydrocarbons having 6 to 20 carbon atoms, such as a phenyl group, a naphthyl group, an anthryl group, a phenanthryl group, a pyrenyl group, a tetracenyl group, a pentacenyl group, a perylenyl group and substituents thereof obtained by substituting some atoms thereof with a substituent group. Among them, the phenyl group is a most preferable in terms of easiness of synthesis reaction in synthesizing the non-conjugated polymer. Examples of the group having the aromatic heterocyclic ring include aromatic heterocyclic ring groups having 4 to 20 carbon atoms, such as a pyrrolyl group, a thiophenyl group, a pyridinyl group, a pyrazinyl group, an indolyl group, an isoindolyl group, a furyl group, a benzofuranyl group, an isobenzofuranyl group, a quinolyl group, an isoquinolyl group, a quinoxalinyl group, phenanthridinyl group, a phenoxazinyl group, an oxazolyl group, and substituents thereof obtained by substituting some atoms thereof with a substituent group.

Subsequently, a description is given of the linking group X. Examples of the linking group represented by X in the above-mentioned structural formulae (1) and (2) include a single bond, an ester bond, an amide bond, an ether bond, a sulfide bond, a sulfonic acid ester bond, an alkylene group and branched alkylene group having 1 to 20 carbon atoms, an alkenylene group having 1 to 20 carbon atoms and the like, and combinations thereof. However, the linking group is not limited to these, as long as the main chain skeleton is linked to the aromatic ring.

The above-mentioned repeated units A and the repeated units B each may have a side chain other than the side chain containing the aromatic group. For example, the repeated units may have a substituent group such as an alkyl group having 1 to 12 carbon atoms, an alkyloxy group, an alkylcarboxyl group, an alkylcarbonylamino group and a substituent group such as halogen.

More specifically, polystyrene and polycinnamic vinyl are especially preferable as the above-mentioned non-conjugated polymer in terms of availability.

The following is a continued description of the gate dielectric film 3. The thickness of the gate dielectric film 3 is not specifically limited; however, the leak current flowing between the gate electrode and the other electrodes cannot be effectively suppressed when the film is too thin, and the switching phenomenon of the active layer by using the gate bias voltage cannot be effectively controlled when the film is too thick. Thus, a preferable range of the film thickness is 0.01 to 1 μm.

Figure 1B:
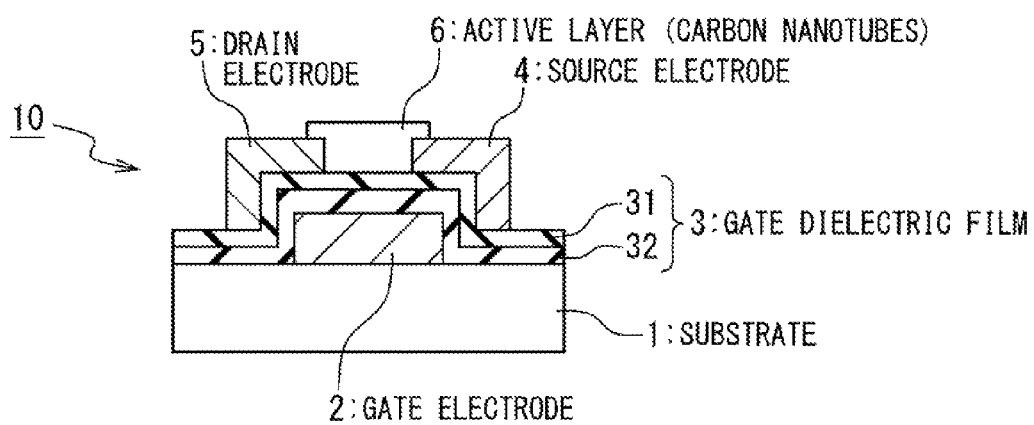
FIG. 1B is a schematic sectional view showing another configuration of the switching element in the first embodiment.

The gate dielectric film 3 may be a single-layer film or a laminated film stack formed by laminating two or more layers. The single-layer film is desirable in terms of simplification of process. However, the laminated film stack formed of the above-mentioned layer containing the non-conjugated polymer (first gate dielectric film layer 31) and an insulating layer made of high dielectric constant material (second gate dielectric film layer 32) may be preferable in terms of reduction in driving voltage for the switching element, as shown in FIG. 1B. However, when the laminated film stack is used, the layer containing the non-conjugated polymer needs to be located in contact with the active layer 6 to produce the interaction between the CNTs and the film. Examples of materials for the second gate dielectric film layer 32 include commonly-used inorganic insulator such as $SiO_2$, SiNx and alumina, and high dielectric constant materials such as titanium oxide, tungsten oxide and tantalum oxide. Insulating polymers such as polyethylene naphthalate and polyethylene terephthalate may be used. However, when a process of forming the first gate dielectric film layer 31 is a wet method, materials for the first and second insulating film layers for forming the laminate structure must have proper resistance to solvents to form the laminate structure. For this reason, a combination satisfying the requirements is selected.

Subsequently, a description is given of a method of manufacturing the switching element 10 in this embodiment. First, the supporting substrate 1 is prepared and the gate electrode 2 is formed on the supporting substrate 1. The method of forming the gate electrode 2 is not specifically limited and commonly-known thin film forming methods can be adopted, including conventionally known methods such as a vacuum deposition method, a spin coating method, a sputtering method and the CVD method, as well as an application method and an application sintering method.

Next, the gate dielectric film 3 is formed so as to cover the gate electrode 2. The method of forming the gate dielectric film 3 is not specifically limited. However, it is preferable that a solution containing the non-conjugated polymer is previously prepared and the solution is applied to a predetermined position on the supporting substrate 1 and dried. In the case where the gate dielectric film 3 is formed as a laminated film stack, the second gate dielectric film layer 32 is first formed and then, the first gate dielectric film 31 containing the non-conjugated polymer is formed on the second gate dielectric film layer 32.

Next, the source electrode 4 and the drain electrode 5 are formed. As in the formation of the gate electrode 2, the method of forming the source electrode 4 and the drain electrode is not specifically limited. Commonly-known methods may be used, including conventionally known methods such as the vacuum deposition method, the spin coating method, the sputtering method and the CVD method as well as the application method and the application sintering method.

Next, the active layer 6 including CNTs is formed so as to be in contact with all of the gate dielectric film 3, the source electrode 4 and the drain electrode 5. At this time, the CNTs can be easily fixed to the gate dielectric film 3, since the interaction is produced between the π electron cloud of the CNTs and the π electron cloud of the aromatic group of the side chain of non-conjugated polymer contained in the gate dielectric film 3.

The method of dispersing the CNTs in the active layer 6 is not specifically limited. For example, a wet method of dispersing the CNTs in a solvent and then applying or scattering the solution, and a dry method of transporting disassembled CNT aggregation by flow of a carrier gas and scattering CNTs on the arrangement surface may be adopted. These methods do not necessarily require a high process temperature, and thus, a heat resistance requirement demanded for the supporting substrate 1 can be lowered, as compared with the CVD method and the like. Consequently, the choices of the supporting substrate 1 can be widened. The wet method among these methods is more preferable than the dry method because of an easy process and small loss of the CNTs used. Examples of liquid dispersion media used for dispersing the CNTs by the wet method include water and general organic solvents such as alcohol, ether, ester, alkylamide, aliphatic hydrocarbon, aromatic compound, but are not limited to these. As a dispersion method, mixing methods such as stirring and milling and any method used in a dispersion step of general pigments, such as ultrasonic radiation can be used. To promote and maintain dispersion, a suitable surface-active agent or a binder may be added. The film forming methods such as a spin coat and a blade coat as well as printing methods such as the ink jet method can be adopted as a method of applying and scattering the CNT solution.

Through the above-mentioned steps, the switching element 10 of the present invention is manufactured. In the present embodiment, since the non-conjugated polymer having the aromatic group in the side chain is used as the gate dielectric film 3, the interaction between the CNTs and the gate dielectric film 3 can be improved. Thereby, it can be prevented that the active layer 6 lacks the CNTs because of the fall-down of the CNTs in the formation. As a result, variations of switching characteristics in the switching element can be suppressed, thereby increasing yield of the arrayed elements.

Second Embodiment

Figure 2A:
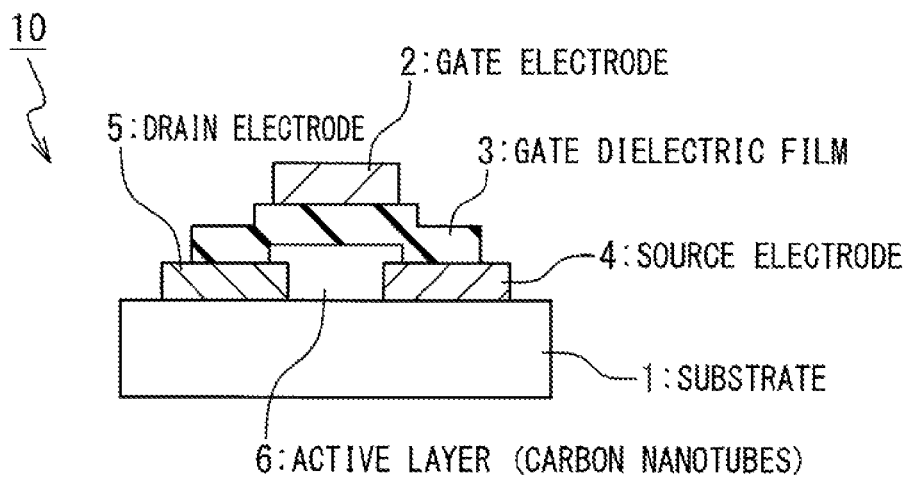
FIG. 2A is a schematic sectional view showing a configuration of a switching element in a second embodiment.

Subsequently, a description is given of a second embodiment of the present invention. FIG. 2A is a schematic sectional view of a switching element 10 of this embodiment. As shown in FIG. 2A, the switching element 10 of this embodiment includes: a supporting substrate 1; source and drain electrodes 4 and 5 which are disposed on the supporting substrate 1 with a distance therebetween corresponding to the channel length; an active layer 6 formed so as to be in contact with these electrodes, a gate dielectric film 3 formed on the source electrode 4, the drain electrode 5 and the active layer 6 and the gate electrode 2 formed on the gate dielectric film 3. That is, the switching element 10 according to the present embodiment has a top-contact structure in which the gate electrode 2 exists on an opposite side to the supporting substrate 1 across the active layer 6. Since materials for the supporting substrate 1, the source electrode 4, the drain electrode 5, the active layer 6, the gate dielectric film 3 and the gate electrode 2 are the same as in the first embodiment, description thereof is omitted.

In manufacturing the switching element 10 of this embodiment, the supporting substrate 1 is first prepared. Then, the source electrode 4 and the drain electrode 5 are disposed on the supporting substrate 1 with the distance therebetween corresponding to the channel length. The active layer 6 is formed so as to be in contact with both the source electrode 4 and the drain electrode 5. The gate dielectric film 3 is formed on the source electrode 4, the drain electrode 5 and the active layer 6. The gate electrode 2 is further formed on the gate dielectric film 3, so that the switching element 10 is manufactured.

Figure 2B:
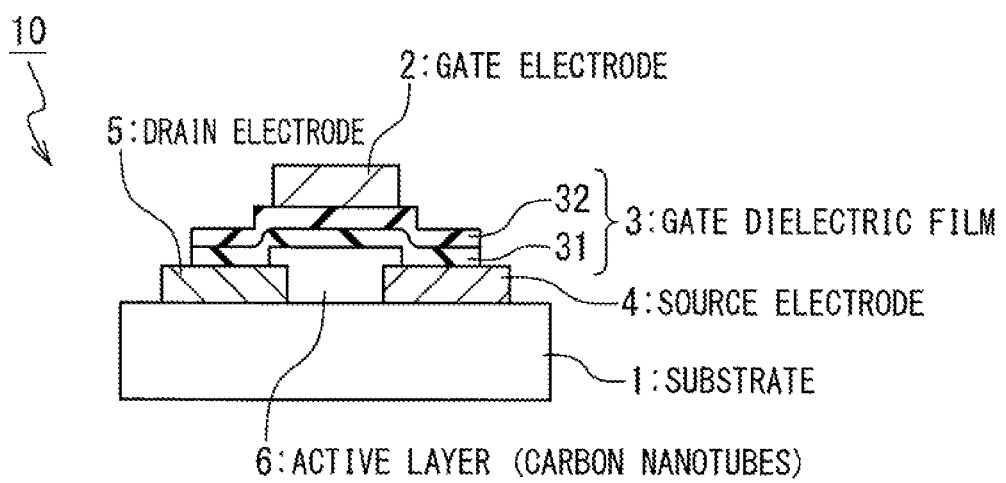
FIG. 2B is a schematic sectional view showing another configuration of the switching element in the second embodiment.

A specific method of forming the source electrode 4, the drain electrode 5, the gate electrode 2, the active layer 6 and the gate dielectric film 3 is not specifically limited and the method described in the first embodiment may be adopted. When a laminated film stack is used as the gate dielectric film 3, as shown in FIG. 2B, the first gate dielectric film layer 31 is first formed and then the second gate dielectric film layer 32 is formed on the first gate dielectric film layer 31, in order to dispose the layer containing the non-conjugated polymer (first gate dielectric film layer 31) to be adjacent to the active layer 6.

With respect to the switching element 10 having the top-contact structure as is the case of this embodiment, in which the gate dielectric film 3 contains the non-conjugated polymer having the aromatic group in the side chain, the interaction can be produced between the gate dielectric film 3 and the active layer 6. This allows suppressing instability of the interface between the active layer 6 and the gate dielectric film 3 and preventing change with time in element characteristics.

To depict effects of the present invention in more detail, a description is given of experiments made by the inventors and the results thereof.

Embodiment 1

A description is given of a method of manufacturing the switching elements 10 of Embodiment 1. The structure of the switching elements 10 of Embodiment 1 is the same as that shown in FIG. 1A. First, a polyethylene naphthalate substrate having a thickness of 0.5 mm was prepared as the supporting substrate 1 and an aluminum film of 100 nm was formed as the gate electrode 2 on the supporting substrate 1 by using a shadow mask according to the sputtering method. Next, a xylene solution of polystyrene (non-conjugated polymer having a aromatic group in the side chain) was applied as the gate dielectric film 3 by a spin coat method and dried at 120° C. to form a film having a thickness of 100 nm. Gold was deposited thereon as the source and drain electrodes 4 and 5 by a vacuum deposition method through a shadow mask so that the source and drain electrodes 4 and 5 have a thickness of 60 nm. In this electrode structure thus formed, the channel width and length were 200 μm and 50 μm, respectively.

SWNTs were prepared as the CNTs and a solution was prepared which is obtained by adding the SWNTs to 0.01% sodium dodecyl sulfonate solution and dispersing the SWNTs by an ultrasonic process for 30 minutes. The prepared solution was applied on the substrate on which the source and drain electrodes were formed at 1000 RPM by a spin coat method. Then, the solution was heated at 120° C. for 30 minutes to remove the solvent. Thereby, the switching element 10 including the active layer 6 having the CNT-dispersed film was obtained.

By using the above-mentioned method, 30 switching elements 10 were made and transistor characteristics of the obtained switching elements 10 were measured respectively. As a result, the ON/OFF ratios (the ratio of the source-drain current at the source drain bias of −4V for the ON state in which the gate voltage=−10V, to that for the OFF state in which the gate voltage=+10V: the same applies to the followings) were about $10^3$, the mode of the current value in the ON state was 50±5 μA and the number of switching elements 10 showing an ON current value of 50% or less of the mode was one.

Embodiment 2

The switching element 10 of Embodiment 2 had a bottom contact structure shown in FIG. 2A. A gold film having a thickness of 60 nm is first formed on the polyethylene naphthalate substrate 1 (supporting substrate 1) having a thickness of 0.5 mm by a vacuum deposition method through a shadow mask, to obtain the source and drain electrodes 4 and 5. The channel width and channel length in the electrode structure thus formed were 100 μm and 50 μm, respectively. A CNT solution obtained by ultrasonic processing of the SWNTs (CNT) in dichloroethan for one hour was applied on the electrodes by means of a blade coat method. The solution was heated at 100° C. for 10 minutes to remove the solvent to form the active layer 6 including the CNT-dispersed film. A xylene solution of polystyrene (non-conjugated polymer having the aromatic group in the side chain) was further applied thereon by a spin coat method. Then, it was heated at 120° C. for 30 minutes to remove the solvent to form the gate dielectric film 3 having a thickness of 120 nm. Aluminum was deposited as the gate electrode 2 on the gate dielectric film 3 by using the shadow mask so as to have a thickness of 100 nm by a vacuum deposition method to obtain the switching element 10 of Embodiment 2.

The transistor characteristics of the switching element 10 of Embodiment 2 thus obtained were measured, and this measurement proved that the ON/OFF ratio was about 7.6× $10^2$ and the current value in the ON state was 15 μA. The characteristics thereof were measured again after the switching element 10 was left in dry air for 20 days, and this measurement proved that the ON/OFF ratio was 7.4×$10^2$ and the current value in the ON state was ±13 μA.

Embodiment 3

In a similar way to Embodiment 1, 30 switching elements 10 were manufactured as Embodiment 3. It should be noted that a propylene glycol monomethyl ether acetate solution of polycinnamic vinyl (non-conjugated polymer having the aromatic group in the side chain) was used as material for forming the gate dielectric film 3.

The transistor characteristics of the switching elements 10 of Embodiment 3 were measured, and this measurement proved that the ON/OFF ratio was about $10^3$, the mode of the current value in the ON state was 80±8 μA and there was no switching element 10 showing the ON current value of 50% or less of the mode.

Embodiment 4

In a similar way to Embodiment 2, the switching element 10 was manufactured as Embodiment 4. It should be noted that a propylene glycol monomethyl ether acetate solution of polycinnamic vinyl (non-conjugated polymer having the aromatic group in the side chain) was used as material for forming the gate dielectric film 3.

The transistor characteristics of the switching element 10 in the fourth example was measured, this measurement proved that the ON/OFF ratio was about 7.4×$10^2$ and the current value in the ON state was 16 μA. The characteristics thereof were measured again after the switching element 10 was left in dry air for 20 days, and this measurement proved that the ON/OFF ratio was 7.3×$10^2$ and the current value at ON time was 15 μA.

Embodiment 5

In a similar way to Embodiment 1, the switching elements 10 were manufactured. It should be noted that the gate dielectric film 3 was formed to have a two-layered structure. That is, in forming the gate dielectric film 3, a tantalum oxide film is formed so as to have a thickness of 70 nm on the supporting substrate 1 on which the gate electrode 2 is formed by a sputtering method to obtain the second gate dielectric film layer 32. After that, a xylene solution of polystyrene (non-conjugated polymer having the aromatic group in the side chain) was applied by a spin coat method and dried at 120° C. for 30 minutes to obtain the first gate dielectric film layer 31 having a thickness of 30 nm.

30 switching elements of Embodiment 5 were manufactured and the transistor characteristics of the obtained switching elements 10 were measured, respectively. This measurement proved that the ON/OFF ratio was about $7 \times 10^3$, the mode of the current value in the ON state was 150±15 µA, and the number of switching elements showing the ON current value of 50% or less of the mode was one.

Embodiment 6

In a similar way to Embodiment 2, a switching element was manufactured. It should be noted that the gate dielectric film 3 was formed to have a two-layered structure. That is, in forming the gate dielectric film 3, a xylene solution of polystyrene (non-conjugated polymer having an aromatic group in a side chain) was applied by a spin coat method and heated at 120° C. for 30 minutes to obtain the first gate dielectric film layer 31 having a thickness of 50 nm and then, a tantalum oxide film was formed so as to have a thickness of 50 nm by a sputtering method to obtain the second gate dielectric film layer 32.

The transistor characteristics of the switching element 10 of Embodiment 6 was measured, and this measurement proved that the ON/OFF ratio was about $5.5 \times 10^3$ and the current value in the ON state was 19 µA. The characteristics thereof were measured again after the elements was left in dry air for 20 days, and this measurement proved that the ON/OFF ratio was $5.3 \times 10^3$ and the current value in the ON state was 17 µA.

Comparative Example 1

In a similar way to Embodiment 1, 30 switching elements were manufactured as Comparative Examples 1. It should be noted that a polypropylene solution was used as a material for the gate dielectric film 3. Polypropylene is not the non-conjugated polymer having an aromatic group in the side chain.

The transistor characteristics of the switching element 10 of Comparative Example 1 were measured, and this measurement proved that the ON/OFF ratio was about $10^3$, the mode of the current value in the ON state was 8±1 µA and the number of switching elements showing the ON current value of 50% or less of the mode was six.

Comparative Example 2

In a similar way to Comparative Example 1, 30 switching elements were manufactured as Comparative Example 2. It should be noted that the step of applying a CNT solution by a spin coat method was repeated five times in forming the active layer 6.

The transistor characteristics of the switching elements of Comparative Example 2 were measured, and this measurement proved that the ON/OFF ratio was about $10^3$, the mode of the current value in the ON state was 40±4 µA, and the number of switching elements showing the ON current value of 50% or less of the mode was two.

Comparative Example 3

In a similar way to Embodiment 2, a switching element in was manufactured as Comparative Example 3. It should be noted that polypropylene which is not non-conjugated polymer having an aromatic group in a side chain was used as material for the gate dielectric film 3.

The transistor characteristics of the switching element of Comparative Example 3 were measured, and the measurement proved that the ON/OFF ratio was $7.5 \times 10^2$ and the current value at the ON state was 14 µA. The characteristics thereof were measured again after the element was left in dry air for 20 days, and this measurement proved that the ON/OFF ratio was $2.7 \times 10^2$ and the current value at the ON state was 10 µA.

(Comparison of Results)

The modes of the current values in the ON state of the switching elements 10 of Embodiments 1, 3, and 5 were higher than those of the switching elements of Comparative Example 1, and the numbers of elements showing an ON current value of 50% or less of the modes of the switching elements 10 of Embodiments 1, 3 and 5 were smaller than that of the switching elements of Comparative Example 1. This result proved that, as compared with the case where the non-conjugated polymer having the aromatic group in the side chain was not used as the gate dielectric film (first comparative example), the switching elements of Embodiments 1 and 3 provide stable switching characteristics by using the non-conjugated polymer having the aromatic group in the side chain as the gate dielectric film.

As compared with the switching elements of Comparative Example 2 in which the number of times of application was increased in forming the active layer 6, the switching elements 10 of Embodiments 1, 3 and 5 exhibited higher modes of the current values in the ON state and reduced numbers of elements showing ON current values of 50% or less of the modes. Since the number of times of application was increased in Comparative Example 2, it was expected that the amount of the CNTs fixed as the active layer 6 increased; however, Embodiments 1, 3 and 5 provide more stable switching characteristics. Therefore, it was found that the use of the non-conjugated polymer having the aromatic group in the side chain as the gate dielectric film 3 as is the case of Embodiments 1, 3 and 5 was more preferable than the increase in the number of times of application as is the case of Comparative Example 2 in terms of improvement of the switching characteristics.

The changes with time in the switching characteristics of the switching elements of Embodiments 2, 4 and 6 were smaller than that of the switching element of Comparative Example 3, which has a similar top-contact structure. The fact revealed that the use of the non-conjugated polymer having an aromatic group in the side chain as the gate dielectric film 3 improved the interaction between the gate dielectric film and the active layer 6, thereby preventing instability of the interface.

What is claimed is:

1. A switching element comprising:
   a gate dielectric film; and
   an active layer disposed in contact with said gate dielectric film,
   wherein said active layer includes carbon nanotubes, and
   wherein said gate dielectric film includes non-conjugated polymer containing an aromatic ring in a side chain,
   wherein said non-conjugated polymer is copolymer of at least one type of repeated units A having an aromatic ring in a side chain and at least one type of repeated units B having no side chain including an aromatic ring, and
   wherein said repeated units A are contained five times or more as much as said repeated units B in mole ratio.

2. The switching element according to claim 1, wherein said gate dielectric film has a thickness of 0.01 to 1.00 µm.

3. The switching element according to claim 1, wherein said gate dielectric film is formed of a single-layer film.

4. The switching element according to claim 1, wherein said gate dielectric film includes:
a first gate dielectric layer disposed in contact with said active layer; and
a second gate dielectric layer disposed not in contact with said active layer, and
wherein said non-conjugated polymer is included in said first gate dielectric layer.

5. The switching element according to claim 1, wherein said non-conjugated polymer is polymer of at least one type of repeated units A having an aromatic ring in a side chain.

6. The switching element according to claim 1, wherein said aromatic ring is an aromatic carbocyclic ring.

7. A switching element comprising:
a gate dielectric film; and
an active layer disposed in contact with said gate dielectric film,
wherein said active layer includes carbon nanotubes, and
wherein said gate dielectric film includes non-conjugated polymer containing an aromatic ring in a side chain,
wherein said non-conjugated polymer includes substituted polyethylene skeletons represented by the following as repeated units:

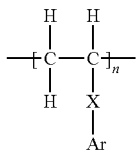

where X represents a linking group or a single bond, Ar represents an aromatic group having the aromatic ring and n represents a positive integer.

8. The switching element according to claim 7, wherein said gate dielectric film has a thickness of 0.01 to 1.00 μm.

9. The switching element according to claim 7, wherein said gate dielectric film is formed of a single-layer film.

10. The switching element according to claim 7, wherein said gate dielectric film includes:
a first gate dielectric layer disposed in contact with said active layer; and
a second gate dielectric layer disposed not in contact with said active layer, and
wherein said non-conjugated polymer is included in said first gate dielectric layer.

11. The switching element according to claim 7, wherein said non-conjugated polymer is polymer of at least one type of repeated units A having an aromatic ring in a side chain.

12. The switching element according to claim 7, wherein said aromatic ring is an aromatic carbocyclic ring.

13. A method of manufacturing a switching element, comprising:
forming a gate dielectric film; and
forming an active layer so as to be in contact with the gate dielectric film,
wherein said gate dielectric film contains non-conjugated polymer having a aromatic ring in the side chain, and
wherein said active layer contains carbon nanotubes,
wherein said non-conjugated polymer is copolymer of at least one type of repeated units A having an aromatic ring in a side chain and at least one type of repeated units B having no side chain including an aromatic, ring, and
wherein said repeated units A are contained five times or more as much as said repeated units B in mole ratio.

14. The method of manufacturing the switching element according to claim 13, wherein said gate dielectric film is formed on a substrate, and
wherein said active layer is formed after the formation of said gate dielectric film.

15. The method of manufacturing the switching element according to claim 14, wherein said step of forming the active layer includes:
applying a carbon nanotube dispersed solution in which the carbon nanotubes are dispersed onto said gate dielectric film; and
drying said applied carbon nanotube dispersed solution.

16. The method of manufacturing the switching element according to claim 14, wherein said step of forming said gate dielectric film includes:
applying a solution containing non-conjugated polymer on said substrate; and
drying the applied solution.

17. The method of manufacturing the switch element according to claim 13, wherein said active layer is formed on said substrate; and
wherein said gate dielectric film is formed after the formation of said active layer.

18. The method of manufacturing the switch element according to claim 17, wherein said step of forming said active layer includes:
applying a carbon nanotube dispersed solution in which carbon nanotubes are dispersed onto said substrate; and
drying said applied carbon nanotube dispersed solution.

19. The method of manufacturing the switch element according to claim 17, wherein said step of forming said gate dielectric film includes:
applying a solution containing said non-conjugated polymer on said substrate; and
drying said applied solution.

20. The method of manufacturing the switch element according to claim 13, wherein said non-conjugated polymer is polymer of at least one type of repeated units A having an aromatic group in a side chain.

21. The method of manufacturing the switch element according to claim 13, wherein said non-conjugated polymer contains substituted polyethylene skeletons represented by the following structural formula as repeated units:

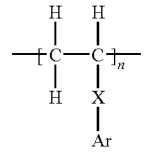

where X represents a linking group or a single bond, Ar represents an aromatic group having an aromatic ring and n represents a positive integer.

22. The method of manufacturing the switch element according to claim 13, wherein said aromatic ring is an aromatic carbocyclic ring.

* * * * *